United States Patent [19]

Maida

[11] 4,334,745
[45] Jun. 15, 1982

[54] EXPOSURE INDICATING DEVICE FOR A CAMERA UTILIZING ANALOG-DIGITAL CONVERTER

[75] Inventor: Osamu Maida, Tokyo, Japan

[73] Assignee: Nippon Kogaku K.K., Tokyo, Japan

[21] Appl. No.: 141,587

[22] Filed: Apr. 18, 1980

Related U.S. Application Data

[62] Division of Ser. No. 907,613, May 19, 1978, Pat. No. 4,262,282.

[30] Foreign Application Priority Data

May 20, 1977 [JP] Japan .................................. 52/57555
Jul. 15, 1977 [JP] Japan .................................. 52/84040

[51] Int. Cl.$^3$ ........................ G03B 7/00; H03K 13/02
[52] U.S. Cl. ............................ 354/60 L; 340/347 AD; 340/347 M; 354/23 D
[58] Field of Search .... 340/347 M, 347 AD, 347 CC; 354/23 R, 23 D, 60 L, 53

[56] References Cited

U.S. PATENT DOCUMENTS

| | | | |
|---|---|---|---|
| 3,316,547 | 4/1967 | Ammann | 340/347 NT |
| 3,935,569 | 1/1976 | Marcel et al. | 340/347 AD |
| 3,949,170 | 4/1976 | Shionoya | 358/141 X |
| 3,990,799 | 11/1976 | Nanba et al. | 354/23 D X |

OTHER PUBLICATIONS

Stephenson, Analog-Digital Conversion Handbook, 1964, Digital Equipment Corp., 1964, pp. 20-22.

*Primary Examiner*—Thomas J. Sloyan
*Attorney, Agent, or Firm*—Fitzpatrick, Cella, Harper & Scinto

[57] ABSTRACT

An indicator arrangement includes comparators for parallel comparison of an analog input voltage with digitalizing standard voltages to digitalize the input voltage and an indicator for indicating digitalized output. The arrangement is provided with a controller periodically switched between a first control state and a second control state. The controller in the first control state allows the comparators to perform comparison in a first voltage range of the analog input voltage while in the second control state it allows the comparators to perform comparison in a second voltage range of the analog input voltage.

There is provided an encoder for coding the digitalized output of the comparators with a first coding mode in the first control state of the controller and coding the digitalized output of the comparators with a second coding mode in the second control state. The encoder is adapted to drive the indicator with a first or second mode according to the state of the controller.

7 Claims, 20 Drawing Figures

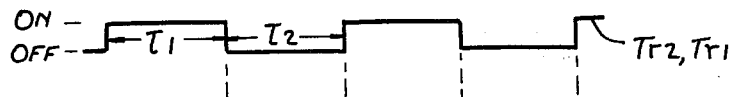
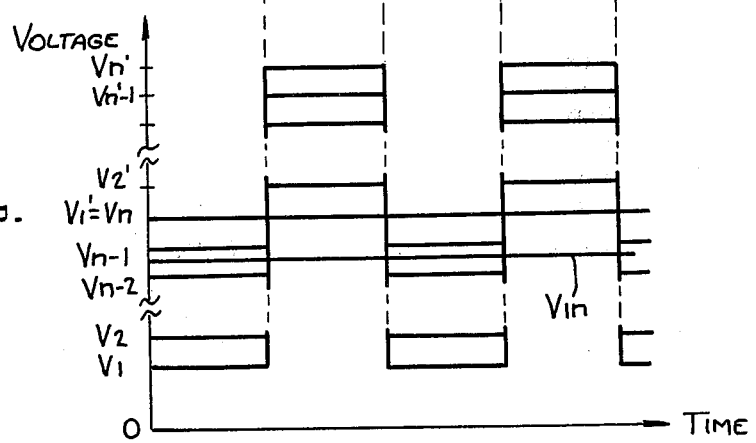
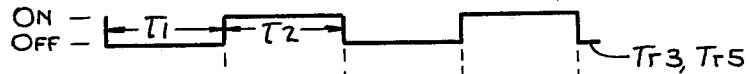
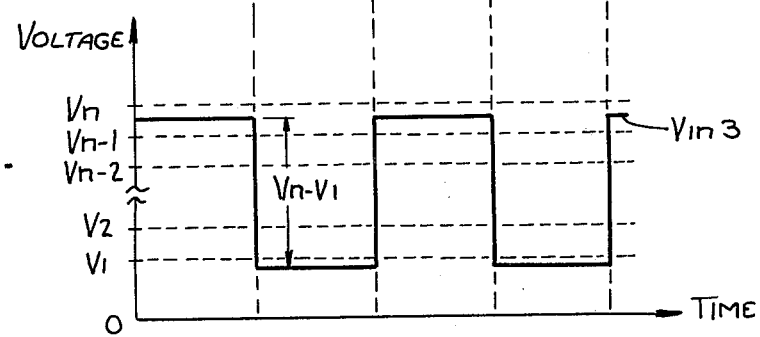

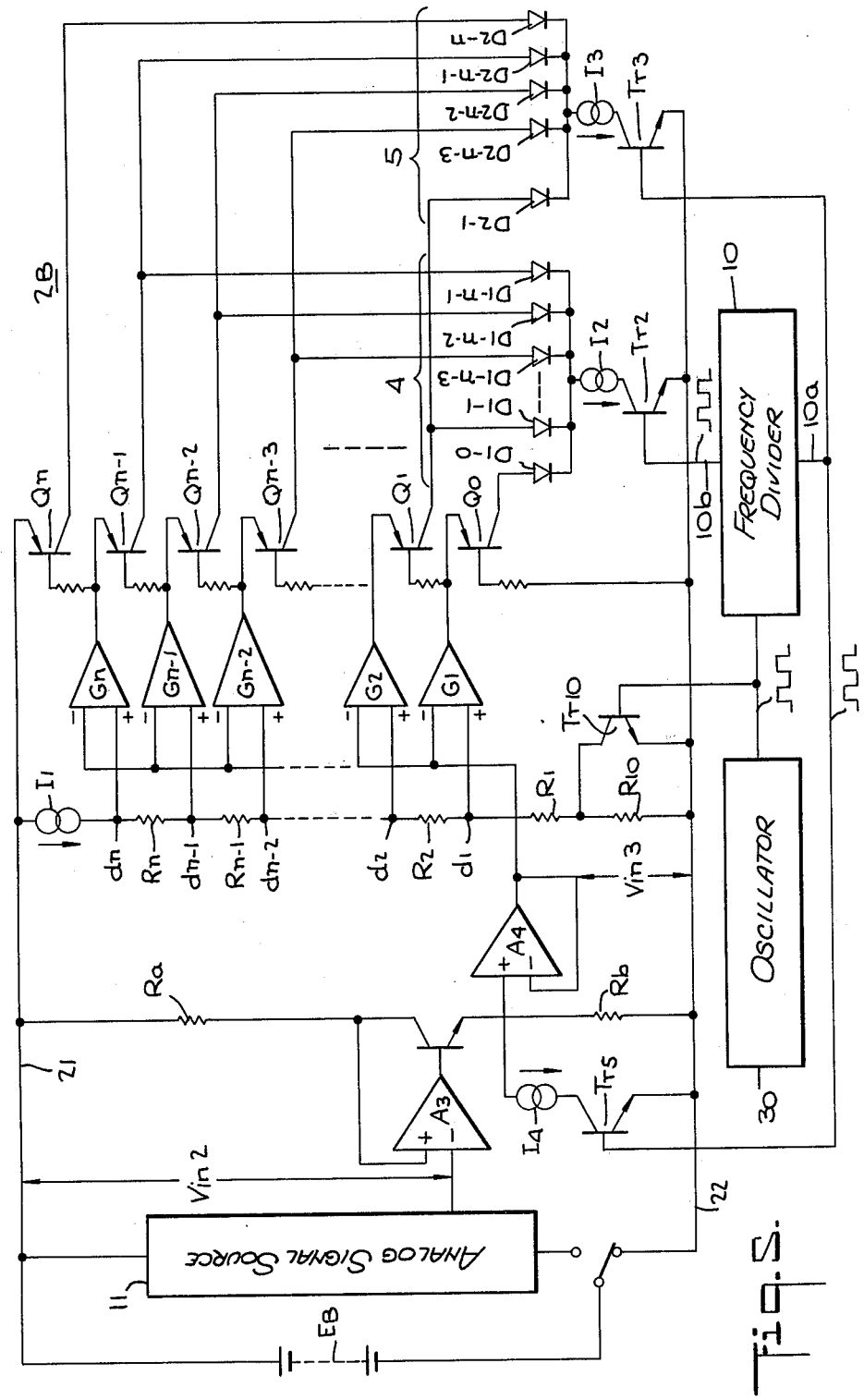

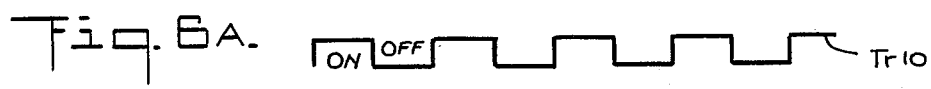
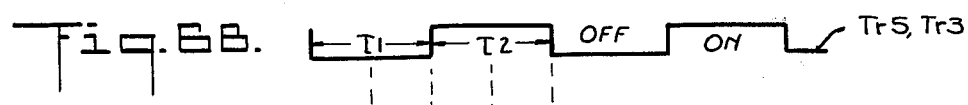
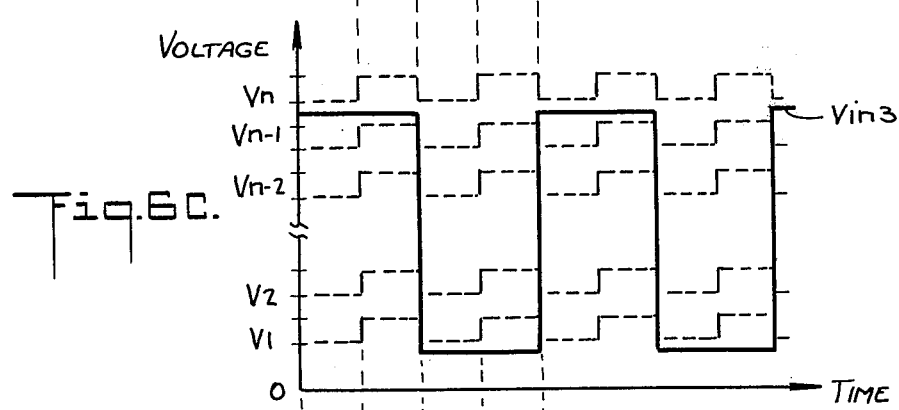
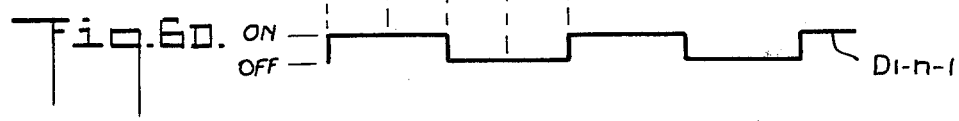
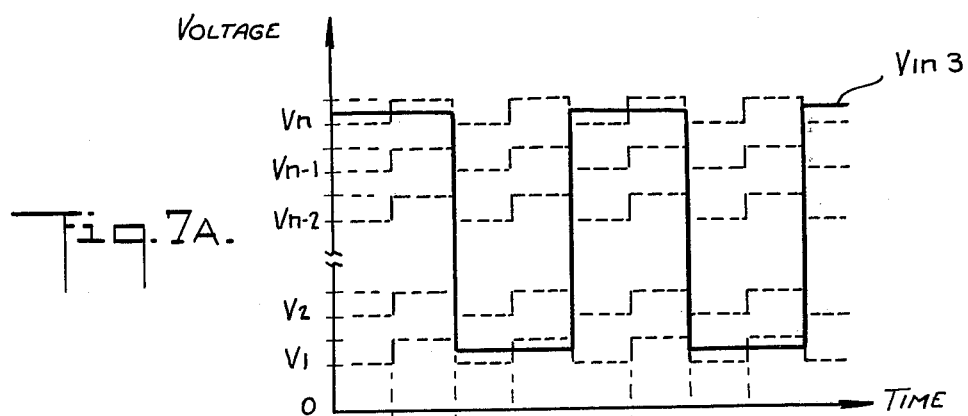
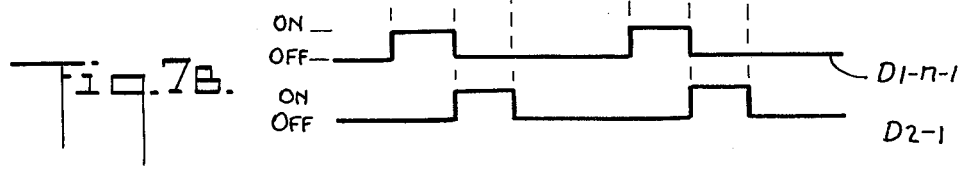

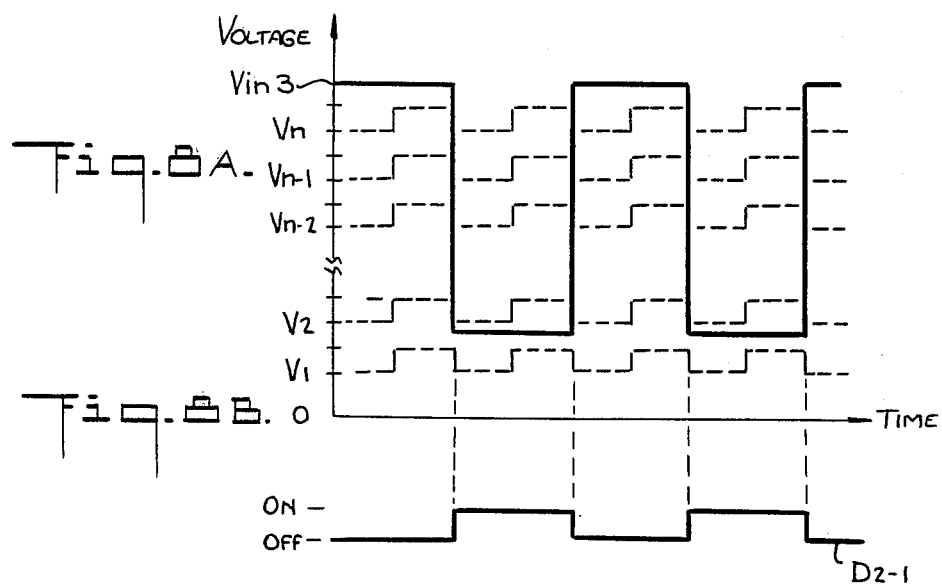
Fig. 9A.
Fig. 9B.
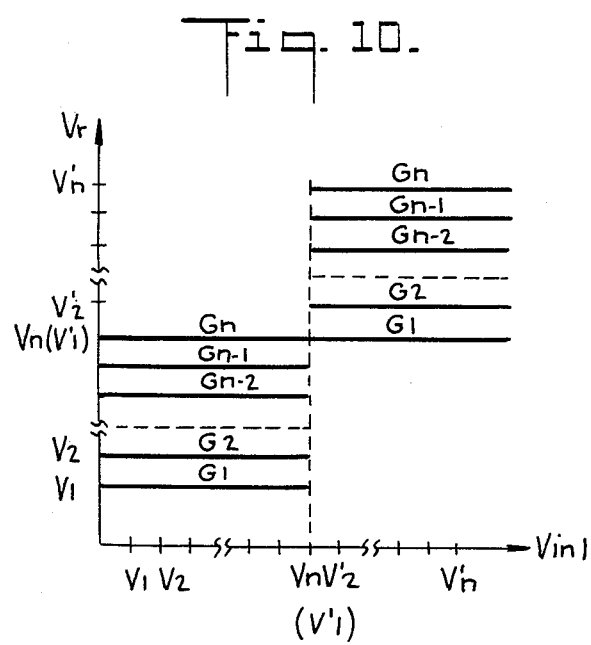
Fig. 10.

EXPOSURE INDICATING DEVICE FOR A CAMERA UTILIZING ANALOG-DIGITAL CONVERTER

This application is a division of application Ser. No. 907,613 filed May 19, 1978, now U.S. Pat. No. 4,262,282 granted on Apr. 14. 1981.

BACKGROUND OF THE INVENTION

1. Field of the Invention

The present invention relates to an indicator arrangement, and more particularly to an exposure indicator arrangement for performing discrete display of an analog input voltage, utilizing a parallel-comparison analog-digital converter (A-D converter).

2. Description of the Prior Art

Conventional indicator arrangements are provided with comparators each of which receives an individually different digitalizing standard voltage as an input and an analog input signal voltage as an another input and gives a digital signal by comparing the two inputs, the digital signal being visually displayed by means of display elements such as light-emitting diodes (LEDs).

Such indicator arrangements are however associated with drawbacks of increased power consumption when the number of display modes by the display elements such as LEDs is increased as the number of comparators, display elements and drive lines therefor increases correspondingly, and also of an increased space occupied by the comparators, etc.

SUMMARY OF THE INVENTION

The object of the present invention is to provide an indicator arrangement not associated with the aforementioned drawbacks of the prior art.

Another object of the present invention is to provide an indicator arrangement of an enlarged display range of the analog input voltage without increasing the number of the comparators.

Still another object of the present invention is to provide an indicator arrangement realizing smaller minimum discrete display levels for the analog input voltage, namely an improved indicating precision, without increasing the number of the comparators.

The foregoing objects of the present invention are achieved by causing an input signal to the comparators to vibrate with an amplitude corresponding to the difference between a highest digitalizing standard voltage and a lowest digitalizing standard voltage thereby allowing the comparators to perform multiple functions.

Also the above objects are achieved by causing the other input signal voltage to the comparators to simultaneously vibrate within a digitalizing unit, or quantization step, voltage range thereby allowing the comparators to perform multiple functions.

Those objects are also achieved by allowing the comparators to perform multiple functions according to an amplitude of the analog input signal.

According to an aspect of the present invention, the indicator arrangement comprising a plurality of comparators for parallel comparison of an analog input voltage with a plurality of digitalizing standard voltages to digitalize the input voltage and a display means for indicating thus digitalized output is provided with a controller periodically switched between a first control state and a second control state, said controller in the first control state allowing the plurality of comparators to perform comparison in a first voltage range of the analog input voltage while in the second control state allowing the plurality of comparators to perform comparison in a second voltage range of the analog input voltage. Further said indicator arrangement is provided with a coding means for encoding the digitalized output of the plurality of comparators with a first coding mode in the first control state of said controller and coding the digitalized output of the plurality of comparators with a second mode in the second control state of said controller, said coding means being adapted to drive said display means in a first or second mode according to the state of said controller.

The upper limit of the first voltage range of analog input voltage may be selected substantially equal to the lower limit of the second voltage range.

Said controller, upon being switched between the first and second control states, may be designed to cause either input to the plurality of comparators to periodically vibrate between the maximum and minimum values of a digitalizing standard voltage.

Also said controller may further comprise a means which causes, in synchronism with switching cycles of the first and second control states, the other input voltage to the plurality of comparators to vibrate over a range smaller than the digitalizing unit, or quantization step, voltage and with cycles different from the above-mentioned cycles.

According to an another aspect of the present invention, a parallel-comparison analog-digital converter for performing parallel comparison of an analog input voltage with digitalizing voltages in the plurality of comparators to convert the analog voltage into a digital output comprises a hold circuit which is retained in a first state when a comparator receiving the largest digitalizing voltage among the plurality of comparators receives an analog input voltage larger than the largest digitalizing voltage, and which is retained in a second state when a comparator receiving the smallest digitalizing voltage among the plurality of comparators receives an analog input voltage smaller than the smallest digitalizing voltage, a control circuit which allows the plurality of comparators to perform comparison of an analog input voltage in a first input voltage range when said hold circuit is in the first state and to perform comparison of an analog input voltage in a second input voltage range lower than the first input voltage range when said hold circuit is in the second state and a coding circuit for encoding the output of the plurality of comparators with a first mode when said hold circuit is in the first state and with a second mode when said hold circuit is in the second state.

Said control circuit may be composed of a digitalizing voltage switching circuit which switches digitalizing voltages to a first digitalizing voltage range when said hold circuit is in the first state thereby enabling the plurality of comparators to perform comparison of an analog input voltage in the first input voltage and switches the digitalizing voltages to a second voltage range lower than the first digitalizing voltage range when said hold circuit is in the second state thereby enabling the plurality of comparators to perform comparison of an analog input voltage in the second input voltage range.

Furthermore said control circuit may be composed of an analog input voltage switching circuit which switches the value of analog input voltage supplied to the plurality of comparators in such a manner as to enable the plurality of comparators to perform comparison in the first input voltage range when said hold circuit is in the first state and to perform comparison in the second input voltage range when said hold circuit is in the second state.

Said hold circuit may be composed of a first comparator receiving the largest digitalizing voltage among the plurality of comparators, a second comparator receiving the smallest digitalizing voltage among the plurality of comparators and a bistable circuit having two states, wherein the first comparator is adapted to release a first output signal upon receipt of an analog input voltage larger than the largest digitalizing voltage, the second comparator being adapted to release a second output signal upon receipt of an analog input voltage smaller than the smallest digitalizing voltage, and said bistable circuit being retained in a first or second state respectively upon receipt of the first or second output signal.

Furthermore said hold circuit may be composed of a first detecting circuit releasing a first output signal when a comparator receiving the largest digitalizing voltage among the plurality of comparators receives an analog input voltage larger than the largest digitalizing voltage, a second detecting circuit releasing a second output signal when a comparator receiving the smallest digitalizing voltage among the plurality of comparators receives an analog input voltage smaller than the smallest digitalizing voltage, and a bistable circuit adapted to be retained in a first or second state respectively upon receipt of the first or second output signal.

BRIEF DESCRIPTION OF THE DRAWINGS

FIGS. 2A and 2B are time charts for use in understanding the function of the first embodiment;

FIGS. 4A and 4B are time charts for use in understanding the function of the second embodiment;

FIG. 5 is a schematic circuit diagram of a third embodiment of the indicator arrangement according to the present invention;

FIGS. 6A, 6B, 6C, 6D, 7A, 7B, 8A and 8B are time charts for use in understanding the function of the third embodiment;

FIG. 10 is a time chart for use in understanding the function of the fourth embodiment;

DESCRIPTION OF THE PREFERRED EMBODIMENTS

Now the indicator arrangement of the present invention will be explained in detail with reference to the accompanying drawings showing the embodiments thereof. In the figures like members are denoted by like symbols.

Figure 1:
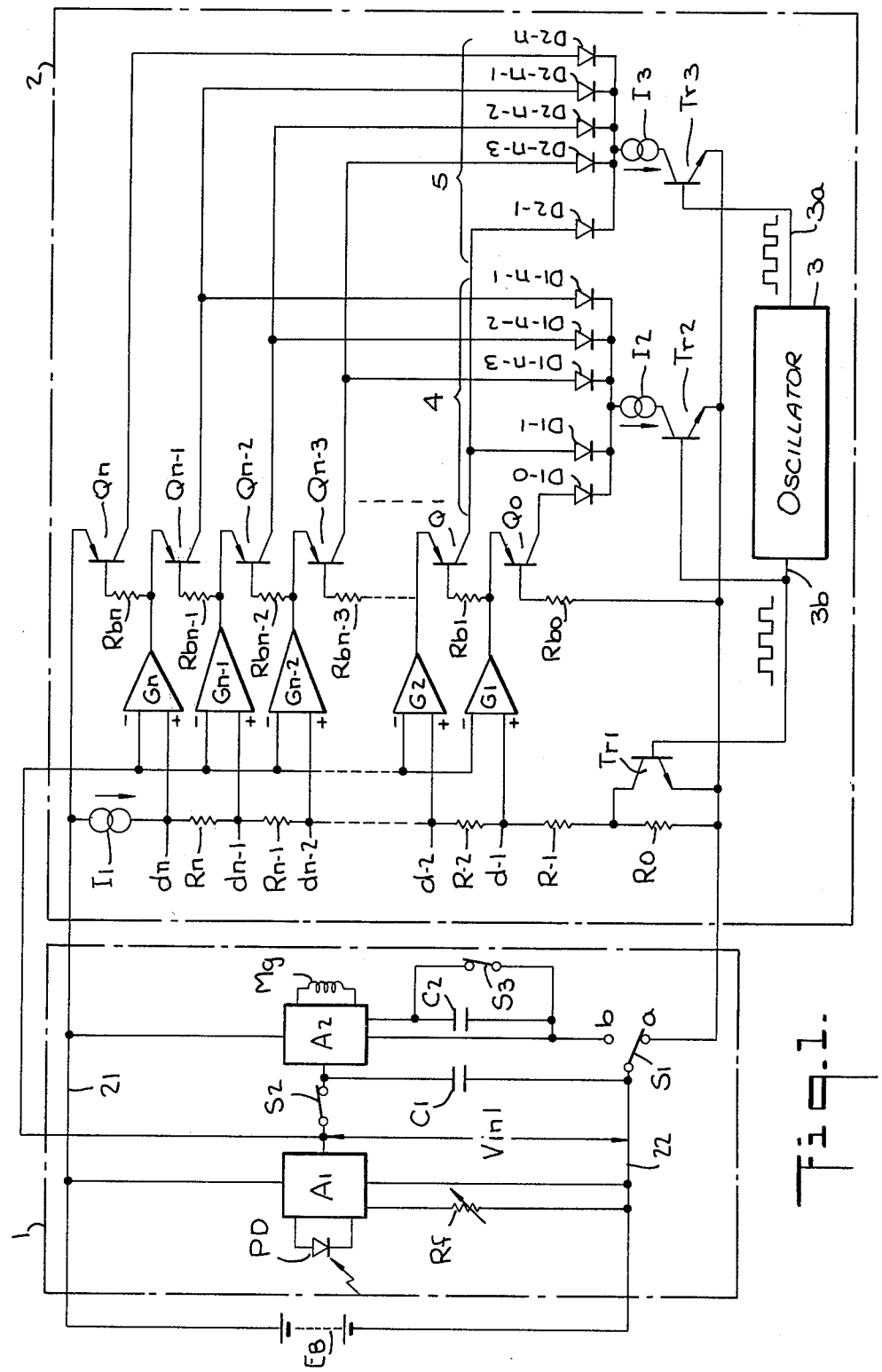
FIG. 1 is a schematic circuit diagram of a first embodiment of the indicator arrangement according to the present invention.

Referring to FIG. 1 showing the circuit of a first embodiment of the indicator arrangement of the present invention wherein an analog signal is obtained from a known electric shutter circuit of a photographic camera, the electric shutter circuit 1 is provided with a memory capacitor C1 which functions as an analog signal source and of which charged voltage is supplied as an input voltage $V_{in1}$ to an indicator arrangement 2. Electric shutter circuit 1 and arrangement 2 are connected between a power feed line 21 connected to a positive terminal of a power source EB and a power return line 22 connected to a negative terminal thereof.

In the electric shutter circuit 1, a first electric signal obtained from a photodiode PD and corresponding to the brightness of an object and a second electric signal obtained from a variable resistor Rf and corresponding to a diaphragm or stop value and the photosensivitity of the photographic film are processed on a first processing circuit A1 releasing a voltage varying stepwise corresponding to a shutter speed for obtaining an optimum exposure, the voltage being memorized in memory capacitor C1. A memory switch S2 and a trigger switch S3 are closed before shutter release and are opened after shutter release. A shutter switch S1 selects a terminal a before shutter release to connect the display circuit 2 with the power source EB and selects a terminal b upon shutter release to connect a second processing circuit A2 to the power source EB.

Upon shutter release a leading curtain of the shutter (not shown) starts running to initiate exposure, and the shutter switch S3 is opened to start charging of the capacitor C2. The second processing circuit A2 compares the charged voltage of capacitor C2 and that of memory capacitor C1 directly before shutter release and triggers a magnet Mg to start the trailing curtain of the shutter (not shown) when these voltages reaches a predetermined relation, thereby achieving an automatic exposure control through shutter speed control. The above-mentioned functions are already known in the art and will not therefore be explained in further detail.

In the indicator arrangement 2 provided are ladder resistors R1-Rn of the same resistance and a ladder resistor R0 to be explained later which are interconnected in series between lines 21 and 22 through a constant-current source I1 to generate, at the connecting points d1-dn thereof, digitalizing standard voltages to be determined by the current from constant-current source I1 and the synthesized resistances. A transistor Tr1 is connected in parallel to ladder resistor R0. An oscillator 3 generates pulse signals of a determined frequency and supplies the signal from an output terminal 3b to the base of transistor Tr1, thus causing transistor Tr1 to periodically oscillate between its ON and OFF states and thus periodically shortcircuiting ladder resistor R0. Thus the digitalizing standard voltages generated at the connecting points d1-dn, each graduated by the same digitalizing unit voltage, or quantization step voltage, and decreasing from dn to d1, are periodically increased, in synchronism with the ON-OFF oscillation of the transistor Tr1, by a voltage determined by the ladder resistor R0 and the current from the constant-current source I1. The ladder resistor R0 is selected in such a manner that the digitalizing standard voltage at the terminal dn when the transistor Tr1 is ON is equal to that at the terminal d1 when the transistor Tr1 is OFF.

Inverted input terminals (−) of comparators G1-Gn are connected through the memory switch S2 to the memory capacitor C1 to receive the charged voltage thereof as an input voltage $V_{in1}$ while the non-inverted input terminals (+) are respectively connected to connecting points d1-dn to receive the digitalizing standard voltages. Each of the comparators releases a high-level signal (H signal) when the input voltage $V_{in1}$ received at the inverted input terminal (−) is lower than the digitalizing standard voltage received at the on-inverted input terminal (+) and a low-level signal (L-signal) in the opposite case. For simplicity of discussion, the potentials of lines 21 and 22 are respectively selected as the levels of H and L signals.

A transistor Q0, connected to the output terminal of comparator G1 through the emitter thereof and to the line 22 through the base thereof and a resistor Rb0 and giving an output through the collector thereof, is turned ON when an H signal is released, or developed, from comparator G1. Also a transistor Q1 connected to the output terminal of the comparator G2 through the emitter and to the output terminal of comparator G1 through the base a resistor Rb1 is provided to give an output to the collector thereof. Similar to transistor Q1, each of transistors Q2-Qn-1 is connected, through the emitter and base thereof, between the output terminals of two comparators of neighboring digitalizing standard voltages to give an output to the collector. Thus, among the transistors Q1-Qn-1, only one transistor Q- receiving an H signal at the emitter from a comparator and an L signal at the base from an another comparator assumes ON state, to give a collector output signifying that the digitalizing voltage at the connecting point d- corresponds to the value of input voltage $V_{in1}$. A transistor Qn connected to the line 21 through the emitter and to the output terminal of comparator Gn through the base and a resistor Rbn and giving an output through the collector assumes ON state when the comparator Gn releases an L signal. Thus transistors Q0-Qn release output encoding the output of comparators G1-Gn.

LED elements D1-0-D1-n-1 belonging to a first LED display element group 4 are provided respectively associatedly with the transistors Q0-Qn-1 and are respectively connected between the collectors of corresponding transistors and a constant-current source I2. The relationship is such that the transistors Q0, Q1, . . . , Qn-1 respectively drive the LED elements D1-0, D1-1, . . . , D1-n-1 thereby achieving the display of the output of transistors Qo-Qn-1 in a first coding mode. LED elements D2-1-D2-n belonging to a second LED display element group 5 are provided respectively associatedly with the transistors Q1-Qn and are respectively connected between the collectors of corresponding transistors and a constant-current source I3. The relationship is such that the transistors Q1, Q2, . . . , Qn respectively drive the LED elements D2-1, D2-2, . . . , D2-n, thereby achieving the display of the output of transistors Q1-Qn with a second coding mode. Thus the drive lines from the transistors Q1-Qn-1 to the first and second LED display element groups 4, 5 are divided into two portions which are respectively connected to groups 4 and 5. The LED display element groups 4 and 5 are for example provided in a finder of a photographic camera to indicate a shutter speed for allowing an optimum exposure. Also the LED display elements D1-0 and D2-n may be utilized to indicate an over exposure and an under exposure, respective in case a shutter speed is located outside the adjustable range. In this manner it is rendered possible to indicate, in the finder, an over exposure, an under exposure, or a shutter speed allowing an optimum exposure.

Also there are provided a transistor Tr2 of which the collector, emitter and base are respectively connected to the constant-current source I2, line 22 and an output terminal 3b of the oscillator 3 and a transistor Tr3 of which the collector, emitter and base are respectively connected to the constant-current source I3, line 22 and the other output terminal 3a of the oscillator. As oscillator 3 release oppositely phased output pulses at output terminals 3a and 3b the transistor Tr3 is shifted from OFF to ON when the transistors Tr1 and Tr2 is shifted from ON to OFF.

Now there will be given a discussion on the function of the foregoing first embodiment while referring to FIGS. 2A and 2B. FIG. 2A shows the ON and OFF states of the transistors Tr1 and Tr2 while FIG. 2B shows the change in the digitalizing standard voltages generated at the connecting points d1-dn corresponding to the ON and OFF states of the transistor Tr1.

When the transistor Tr1 is in its ON state, the connecting points d1-dn generate digitalizing standard voltages in a first voltage range of which the highest voltage is determined by the product of the synthesized, or total, resistance of ladder resistors R1-Rn and the current from the constant-current source I1. When the transistor Tr1 is in OFF state, the points generate digitalizing standard voltages in a second voltage range of which the highest voltage is determined by the product of the synthesized resistance of ladder resistors R0-Rn and the constant current and of which the lowest is equal to the highest digitalizing standard voltage in the first voltage range. FIG. 2B shows the standard voltages V1-Vn in the first range and those V1'-Vn' in the second range. The oscillator 3 maintains the transistors Tr1, Tr2 in their ON state and the transistor Tr3 in its OFF state during a determined period $\tau 1$ and maintains those transistors in inverted states during a succeeding determined period $\tau 2$. Thus when the transistors Tr1, Tr2 are in ON state and the transistor Tr3 is in OFF state, the digitalizing standard voltages are in the first range to enable the function of first LED display element group 4 and to disable the function of display element group 5 (this state being hereinafter referred to as a first function state of the indicator arrangement). Also when the transistors Tr1, Tr2 are in OFF state and the transistor Tr3 is in ON state, the digitalizing standard voltages are in the second range to disable the function of first LED display element group 4 and to enable the function of display element group 5 (this state being hereinafter referred to as a second function state of the indicator arrangement).

When the indicator arrangement 2 is in the first function state, namely when the digitalizing standard voltages are in the first range, the comparators G1-Gn release, or produce, H signals at the output terminals thereof if the input voltage $V_{in1}$ is lower than the standard voltage V1 at the connecting point d1 ($V_{in} < V1$). Thus the transistors Q1-Qn, receiving the H signals at the bases and emitters thereof, are all in the OFF state, and transistor Q0 alone is in ON state, receiving L signal at the base thereof. The transistors Tr1 and Tr2 being in ON state in synchronism with the pulse signal from the oscillator 3, the ON state of transistor Q0 drives the LED display element D1-0 of the first LED display element group 4. When the indicator arrangement is shifted to the second function state wherein the digitalizing standard voltages are in the second range, the comparators G1-Gn all release H signals since $V_{in}$ is still smaller than V1'. In this state, therefore, all the LED elements are disabled since the transistor Tr2 is shifted to its OFF state though the transistor Q0 is in its ON state. Upon returning of the A-D converter to the first function state, the LED display element D1-0 is again lighted.

Now, in case the input voltage $V_{in1}$ is elevated to a value located between the digitalizing standard voltages V1 and V2 of the connecting points d1 and d2 ($V1 < V_{in} < V2$) during the first function state of the indicator arrangement 2, the comparator G1 releases an L signal while the comparators G2-Gn continue to release H signals. In this state the transistors Q2-Qn continue to be in OFF state receiving H signals at the bases and emitters thereof and the transistor Q0 is shifted to its OFF state receiving L signals at the base and emitter thereof, while the transistor Q1 alone is shifted to its ON state receiving an L signal from the comparator G1 and an H signal from the comparator G2 respectively at the base and emitter thereof. When the digitalizing standard voltages are located in the first range, the LED display element D1-1 in the first LED display element group 4 is lighted while the element D2-1 in the second group 5 is not lighted as the transistors Tr1 and Tr2 are in ON state while the transistor Tr3 is in OFF state. When the indicator arrangement is shifted from that state to the second function state wherein the states of the transistors are inverted and the digitalizing standard voltages are located in the second range, all the comparators G1-Gn release H signals because of the relationship $V_{in} < V1'$. Thus all the LED elements are disabled since the transistor Tr2 is shifted to OFF state through the transistor Q0 is in ON state.

Thus with the increase of the input voltage $V_{in1}$, the transistor in ON state is shifted from Q2 to Q3, then to Q4 and so on, and the lighted LED display element is correspondingly shifted from D1-3, then to D1-4 and so on. Further, when the input voltage $V_{in1}$ reaches a value located between the digitalizing standard voltages Vn-1 and Vn at the connecting points dn-1 and dn (Vn-1 < $V_{in}$ < Vn) during the first function state of the indicator arrangement, the comparator Gn releases an H signal while the comparators G1-Gn-1 release L signals, thus maintaining the transistor Qn-1 in ON state and remaining transistors Q1-Qn-2 and Qn in OFF state. As the digitalizing standard voltages are in the first range, the LED display element D1-n-1 alone is lighted. As explained in the foregoing, the LED display elements in the second LED display element group 5 do not function when the indicator arrangement is shifted to the second function state wherein the digitalizing standard voltages are in the second range.

Now, when the input voltage $V_{in1}$ is elevated to a value higher than the digitalizing standard voltage Vn at the connecting point dn during the first function state of the indicator arrangement 2, all the comparators G1-Gn release L signals to shift the transistor Qn to ON state, but the LED element D2-n in the second LED group 5 is not lighted since the transistors Tr1, Tr2 and transistor Tr3 are respectively in the ON and OFF states. When the indicator arrangement 2 is shifted to the second function state with the transistors Tr1, Tr2 in OFF state and transistor Tr3 in ON state and with the digitalizing standard voltages in the second range, the digitalizing voltage V1' at the connecting point d1 becomes equal to the standard voltage Vn in the first range (see FIG. 2B), i.e. $V1' < V_{in} < V2'$. In this state therefore the comparator G1 releases an L signal while the remaining comparators G2-Gn release H signal to shift the transistor Q1 to ON state thereby lighting the LED element D2-1 in the second LED group 5. Upon further increase of the input voltage $V_{in1}$, the comparator releasing the L signal when the digitalizing standard voltages are in the second range is shifted from G2 to G3, then to G4 and so on, and the lighted LED element in second LED group 5 is correspondingly shifted from D2-1 to D2-2, then to D2-3 and so on. Finally the comparator Gn releases an L signal to light the LED element D2-n, indicating that the input voltage $V_{in1}$ is higher than the highest digitalizing standard voltage Vn' in the second range.

Upon decrease of the input voltage $V_{in1}$ from this state, the LED display elements in the second LED group 5 are correspondingly lighted while voltage $V_{in1}$ is located within the second range of the digitalizing standard voltages, whereas those in the first LED group 4 are similarly lighted while voltage $V_{in1}$ is located within the first range of the digitalizing standard voltages. The LED display elements in the first and second LED groups 4, 5 oscillate between on and off states in the frequency of oscillator 3 as the transistors Tr2 and Tr3 are alternately turned on by oscillator 3, but a visually continuous lighting is obtained if the frequency is selected relatively high.

Figure 3:
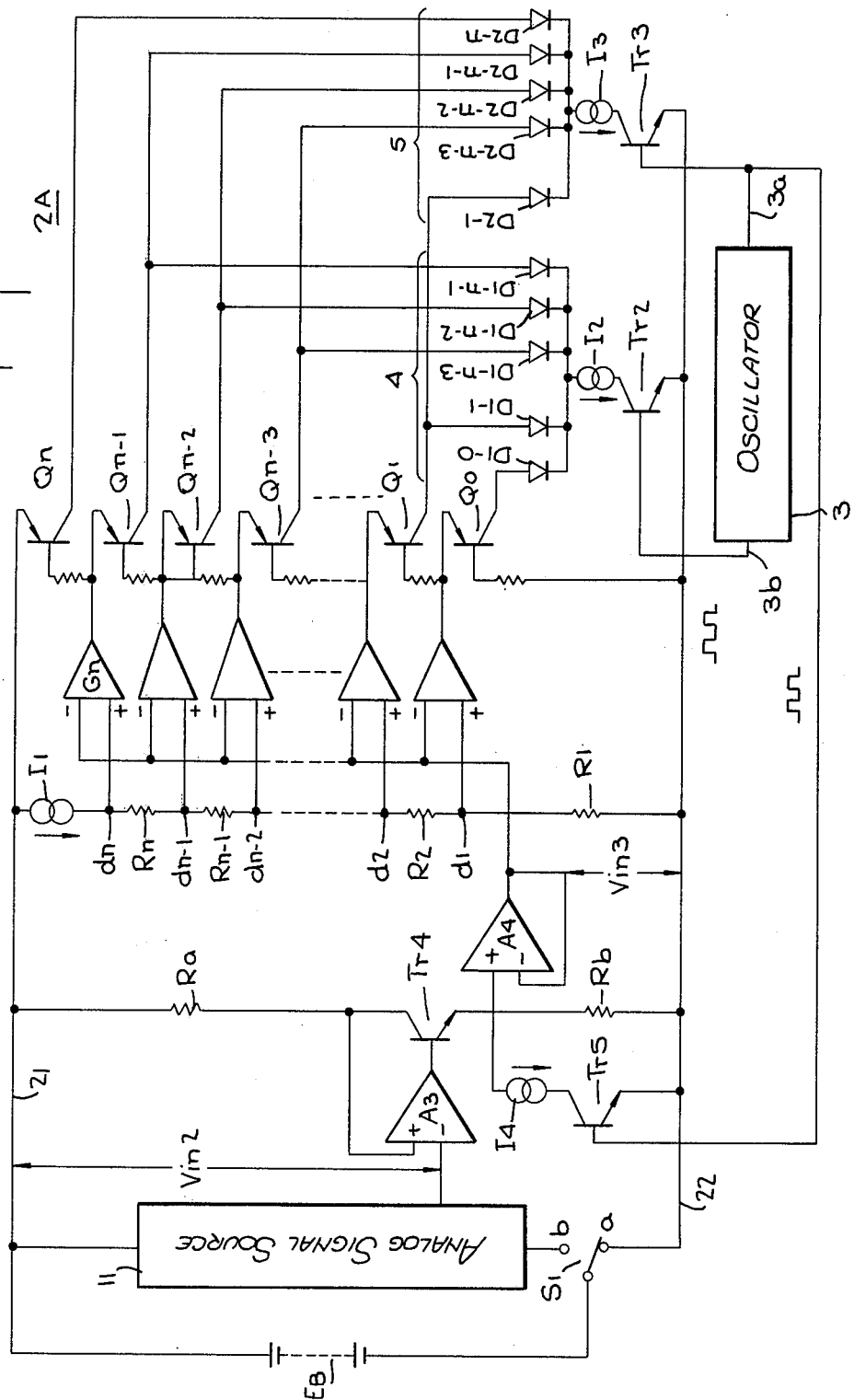
FIG. 3 is a schematic circuit diagram showing a second embodiment of the indicator arrangement according to the present invention.

FIG. 3 shows a second embodiment of the indicator arrangement of the present invention, wherein the portions of indicator arrangement 2A common with those in the foregoing arrangement 2 in FIG. 1 are indicated by the same symbols and will not be discussed in detail. In this second embodiment the digitalizing standard voltages applied to the non-inverted input (+) of the comparators G1-Gn are maintained fixed while the analog voltage applied to the inverted inputs (−) is vibrated.

Referring to FIG. 3, an analog input voltage $V_{in2}$ from an analog signal source 11 is applied between an inverted input terminal (−) of an operational amplifier A2 and the power feed line 21. Also the non-inverted input terminal (+) of the operational amplifier A3 is connected through a resistor Ra to the power feed line 21. Also there is provided a transistor Tr4 of which the collector is connected to the connecting point between the non-inverted input terminal (+) and the resistor Ra, the base is connected to the output terminal of said operational amplifier A3 and emitter to the line 22 through a resistor Rb. Amplifier A3 and transistor Tr4 constitute a constant-current circuit for feeding a current determined by the analog input voltage $V_{in2}$ and the resistor Ra to the resistor Rb, the emitter current of transistor Tr4 being substantially equal to the collector current thereof if $h_{fe}$ of transistor Tr4 is to be selected much larger than unit. An operational amplifier A4 of which the non-inverted and inverted input terminals are respectively connected to the connecting point between the emitter of transistor Tr4 and resistor Rb and to the output terminal of the amplifier, constitutes therefore a voltage follower circuit releasing a second analog voltage $V_{in3}$ identical with the voltage generated at the resistor Rb, the second analog voltage being compared with the digitalizing standard voltages at the connecting points d1-dn by means of the comparators G1-Gn. The resistor R0 and transistor Tr1 in the first embodiment are eliminated in this second embodiment. A constant-current source I4 is connected in parallel to the resistor Rb, and a transistor Tr5 receives at the base thereof pulse signals of a determined frequency from the other output terminal 3a of the oscillator 3 and controls the emitter current of the transistor Tr4 to be divided to constant-current source I4. The voltage generated at the resistor Rb, namely the second analog voltage $V_{in3}$ released from the operation amplifier A4 is made to oscillate by switching the current supplied to constant-current source I4. The constant-current source I4 and the resistor Rb are selected in such a manner that the second analog voltage $V_{in3}$ in the ON state and OFF state of the transistor Tr5 changes by the difference of the digitalizing standard voltages at the connecting point dn and at the connecting point d1.

FIGS. 4A and 4B are time charts respectively indicating the ON-OFF change of transistors Tr2 and Tr3, and the change of second analog voltage corresponding to the ON-OFF change of transistor Tr5.

Now there will be given a discussion on the function of this second embodiment with reference to FIGS. 4A and 4B. As shown in these figures, the oscillator 3 maintains the transistors Tr3 and Tr5 in ON state and the transistor Tr2 in OFF state during a determined period τ1, then maintains those transistors in their inverted states during a succeeding determined period τ2, and repeats these changes periodically. Thus with the transistors Tr5 and Tr3 in OFF state and transistor Tr2 in ON state, the second analog voltage $V_{in3}$ assumes a value determined by the emitter current of transistor Tr4 and the resistor Rb, and the first and second LED display element groups 4, 5 are respectively in enabled and disabled states (this situation being hereinafter referred to as a third function state of the indicator arrangement).

Also with the transistors Tr5 and Tr3 in ON state and transistor Tr2 in OFF state, the second analog voltage $V_{in3}$ assumes the above-mentioned value minus a difference between the highest digitalizing standard voltage Vn and the lowest voltage V1, and the second and first LED display element groups 5 and 4 are respectively in the enabled and disabled states (this situation being hereinafter referred to as a fourth function state of the indicator arrangement). It is to be understood that the first and second function states in the first embodiment are essentially equivalent to the third and fourth function states in this second embodiment, since in the former the voltages applied to the non-inverted input terminal (+) of the comparators G1-Gn are oscillated by the difference while in the latter the voltage applied to the inverted input terminals (−) thereof are likewise oscillated.

When the second analog voltage $V_{in3}$ is lower than the digitalizing voltage V1 in the third function state of the indicator arrangement 2A, all the comparators G1-Gn release H signals to shift the transistor Q0 alone to ON state thereby lighting the LED element D1-0. Upon shifting to the fourth function state, the comparators G1-Gn release H signals as the second analog voltage $V_{in3}$ is lower than the digitalizing voltage V1, and no LED elements are lighted though the transistor Q0 is in ON state since the transistors Tr2 and Tr3 are respectively in OFF and ON states. The LED element D1-0 is again lighted upon returning of the indicator arrangement to the third function state, thereby indicating that the input voltage $V_{in2}$ is lower than the digitalizable value.

When the second analog voltage $V_{in3}$ reaches a value between the standard voltages V1 and V2 during the third function state, the comparator G1 releases an L signal while the remaining comparators G2-Gn release H signals to shift the transistor Q1 to ON state thereby lighting the LED element D1-1. Upon shifting to the fourth function state no LED elements are lighted, and upon returning to the third function state the LED elements D1-1 is again lighted. Along with the increase of the second analog voltage $V_{in3}$ corresponding to the increase of the input voltage $V_{in2}$, the comparator releasing L signal is shifted from G2 to G3, then to G4 and so on, with the corresponding shift of the lighted LED element from D1-2 to D1-3, then to D1-4 and so on.

Now, when the second analog voltage $V_{in3}$ reaches a value higher than the digitalizing standard voltage Vn in the third function state of the indicator arrangement 2A, all the comparators G1-Gn release L signals to shift the transistor Qn, but the LED element D2-n is not lighted as the transistor Tr3 is in its OFF state. Upon shifting to the fourth function state wherein the second analog voltage $V_{in3}$ is lowered by the difference in comparison with that in the third function state, the second analog voltage becomes located between the standard voltages V1 and V2 whereby the comparator G1 releases an L signal whereas the remaining comparators G2-Gn release H signals to shift the transistor Q1 alone to ON state, thereby lighting the LED element D2-1 alone since the transistors Tr3 and Tr2 are respectively in ON and OFF states. Upon further increase of the analog input voltage $V_{in2}$, the LED elements in the second LED element group 5 are in turn lighted during the fourth function state of the indicator arrangement. At an analog input voltage $V_{in2}$ wherein the second analog voltage $V_{in3}$ exceeds the standard voltage Vn, the LED element D2-n is lighted and this state is not changed by a further increase of the analog input voltage $V_{in2}$. In this manner it is indicated that the input voltage $V_{in2}$ is higher than the digitalizable value.

When the analog input voltage $V_{in2}$ is reduced from the above-mentioned state, the comparators G1-Gn and transistors Q1-Qn follow the above-mentioned functions in the reversed order, and the lighted LED element is correspondingly shifted from the second group 5 to the first group 4.

FIG. 5 shows a third embodiment of the indicator arrangement of the present invention wherein the portions of the indicator arrangement 2B common to those in the arrangement 2A in FIG. 3 are indicated by the same symbols and will not be explained in detail. In FIG. 5 a resistor R10 and a parallel transistor Tr10 are connected between the ladder resistor R1 and the line 22, wherein the value of resistor R10 is selected half as much as that of other ladder resistors R2-Rn so that the digitalizing standard voltages V1-Vn generated at the connecting points d1-dn oscillate with an amplitude equal to a half of the unit digitalizing voltage according to the ON-OFF change of transistor Tr10. A periodic square-wave signal generated by an oscillator 30 is supplied to the base electrode of transistor Tr10 and to the input terminal of a frequency divider 10 consisting of a flip-flop circuit, frequency divider 10 releasing to the output terminals 10a, 10b output signals of a frequency for example equal to a half of the frequency of the oscillator 30, those square-wave output signals being mutually opposite in phase. The transistor Tr2 receives a square-wave signal from one output terminal 10b of divider 10 while the transistors Tr3, Tr5 receive the signal from the other output terminal 10a thereof. Consequently the indicator arrangement 2B repeatedly assumes the third and fourth function states in synchronism with the frequency of the square-wave signals from the frequency divider 10, wherein each digitalizing standard voltage oscillates with an amplitude equal to a half of the unit digitalizing voltage.

In the following there will be explained the operation of the third embodiment. When the transistor Tr10 is in ON state upon receipt of a square-wave signal from the oscillator 30, the resistor R10 is shortcircuited to generate lower digitalizing voltages at the connecting points d1-dn. When the transistor Tr10 is in OFF state the resistor R10 is released from shortcircuiting to generate higher digitalizing voltages at said points. When the second analog voltage $V_{in3}$ is lower than the lower value of the digitalizing voltage V1 during the third function state of the indicator arrangement, all the comparators G1-Gn release H signals to shift the transistor Q0 to ON state thereby lighting the LED element D1-0. Upon shifting to the fourth function state all the LED elements are extinguished as in the second embodiment, and upon returning to the third function state the LED element D1-0 is again lighted.

When the analog input voltage $V_{in2}$ is elevated to shift the second analog voltage $V_{in3}$ to a value between the lower and higher values of the digitalizing standard voltage V1 in the third function state, the comparator G1 release L and H signals alternately corresponding to the ON and OFF states of the transistor Tr10 while the remaining comparators G2-Gn all release H signals. Upon release of L signal by the comparator G1, the transistors Q0 and Q1 are respectively in the OFF and ON states to light the LED element D1-1 alone, and upon release of H signal the transistors are respectively in the ON and OFF states to light the LED element D1-0 alone. In the fourth function state all the LED elements are extinguished since the second analog voltage $V_{in3}$ is lower than the lowest standard voltage V1 and transistor Tr2 is in OFF state. Since the above functions are repeated in the frequency of the output pulses from the frequency divider 10, a visually continuous lighting of the LED elements D1-0 and D1-1 is realizable if the frequency is selected relatively high.

When the analog input voltage $V_{in2}$ is further elevated to shift the second analog voltage $V_{in3}$ to a value between the higher value of the standard voltage V1 and the lower value of the standard voltage V2 during the third function state of the indicator arrangement 2B, the comparator G1 develops an L signal while remaining comparators G2-Gn release H signals to shift the transistor Q1 to ON state thereby lighting the LED element D1-1. In the succeeding fourth function state all the LED elements, including LED element D1-1 are extinguished, and upon returning to the third function state the LED element D1-1 is again lighted. Along with the further increase of the analog input voltage $V_{in2}$, the above-mentioned functions of lighting of one element and of alternate lighting of two elements are successively shifted from the LED element D1-1 toward D1-n.

FIGS. 6A, B, C and D show the time charts of the above-explained operations, wherein FIG. 6A indicates the ON-OFF functions of transistor Tr10, FIG. 6B indicating the ON-OFF functions of transistors Tr2 and Tr5, FIG. 6C showing the changes in the standard voltages V1-Vn and in second analog voltage $V_{in3}$ corresponding to the ON-OFF functions of transistors Tr10 and Tr5 and indicating that the second analog voltage $V_{in3}$ is located between the higher value of standard voltage Vn-1 and the lower value of standard voltage Vn in the third function state and is located lower than the standard voltage V1 in the fourth function state. FIG. 6D indicates that an LED element D1-n-1 alone is lighted in case of FIG. 6C. Thus, when the second analog voltage $V_{in3}$ reaches a value located between the lower value of the standard voltage Vn and higher value thereof during the third function state, the comparator Gn alternately produces L and H signals associatedly with the ON-OFF changes of the transistor Tr10. Upon release of L signal from comparator Gn to shift the transistor Qn to ON state all the LED elements including element D2-n are extinguished since the transistor Tr3 is in OFF state in the third function state, while upon release of H signal from the comparator Gn the transistor Qn-1 is shifted to ON state and the LED element D1-n-1 is lighted as the transistor Tr2 is ON in this state.

Upon shifting thereafter of the indicator arrangement to the fourth function state by the square-wave signal from the frequency divider 10, the transistor Tr5 is turned ON and the second analog voltage $V_{in3}$ reaches a value between the lower and higher values of the standard voltage V1 whereby the comparator G1 releasing H and L signals alternately correspondingly to the ON-OFF changes of the transistor Tr10 while the remaining comparators G2-Gn releasing H signals. Thus the transistor Q1 is shifted to ON state when the transistor Tr10 is ON to light the LED element D2-1. When the transistor Tr10 is turned OFF in the fourth function state, the second analog voltage $V_{in3}$ becomes lower than the higher value of the standard voltage V2 whereby all the comparators G1-Gn release H signals and all the LED elements including said element D2-1 are extinguished because of the OFF state of transistor Tr2. Thus in this case the LED elements D1-n-1 and D2-1 are alternately lighted corresponding to the third and fourth function states.

FIGS. 7A and 7B are time charts of the abovementioned functions. FIG. 7A indicates the changes in the standard voltages V1-Vn and in second analog voltage $V_{in3}$ corresponding to the ON-OFF changes of the transistors Tr5 and Tr10 while FIG. 7B indicates the lighting of LED elements D1-n-1 and D2-1. FIG. 8A shows a state, in the fourth function state, of an analog input voltage $V_{in2}$ further elevated from the state shown in FIG. 7A with a second analog voltage $V_{in3}$ located between the higher value of the standard voltage V1 and the lower value of the standard voltage V2. FIG. 8B shows that the LED element D2-1 alone is lighted in the fourth function state and that all the LED elements are extinguished in the third function state. Thus, along with the further increase of the analog input voltage $V_{in2}$, the LED element or elements lighted singly or alternately are shifted from D2-1 toward D2-n, and the element D2-n is singly lighted in the final state.

Naturally the above-explained functions are repeated in the reverse order when the analog input voltage $V_{in2}$ is decreased.

In this third embodiment the number of display modes is approximately twice as much as that in the foregoing first and second embodiments.

Although in this embodiment the oscillating frequency of the digitalizing voltages is selected half as much as the oscillating frequency of the second analog voltage, a similar effect can be obtained as long as the frequencies are not the same and as long as there exists a relationship of a multiple therebetween.

In the foregoing description of the third embodiment one set of the input voltages to the comparators G1-Gn is made to oscillate with an amplitude corresponding to a half of the unit digitalizing voltage levels, but it is also possible to employ the following method. If the one set of the input voltages to the comparators is made to oscillate with an amplitude larger than a half of the unit digitalizing voltage, the range of analog input voltage over which the LED elements are lighted becomes larger than the range of lighting of one LED element, and vice versa, such arrangements being suitably employable according to a purpose.

Also in the foregoing third embodiment the analog input voltage is made to oscillate with an amplitude equal to the difference between the highest digitalizing standard voltage Vn and the lowest standard voltage V1 and the digitalizing standard voltages are simultaneously made to oscillate with an amplitude equal to a value half as much as the unit digitalizing voltage, but it is also possible to employ an inverted relationship.

Furthermore it is also possible to obtain an effect similar to that of the third embodiment by oscillating either the analog input voltage or the digitalizing standard voltages by overlapping the difference between the highest and lowest digitalizing standard voltages Vn and V1 with a half of the unit digitalizing voltage. Also the display elements may be composed of other electro-optical elements such as incandescent lamps, liquid crystal devices, electrochromic elements, electroluminescence devices, fluorescent discharge tubes etc.

According to the present invention wherein one set of the input signals to plural comparators is made to oscillate with an amplitude equal to the difference between the highest and lowest digitalizing standard voltages, each comparator functions periodically as if it received two different digitalizing standard voltages. Consequently the digitalizable range of analog input signal is doubled for a given number of comparators, without any change in the power consumption. Also the number of ladder resistors remains the same, thus allowing to reduce the chip area in the case of preparing an integrated circuit for the analog-digital converter.

Figure 9:
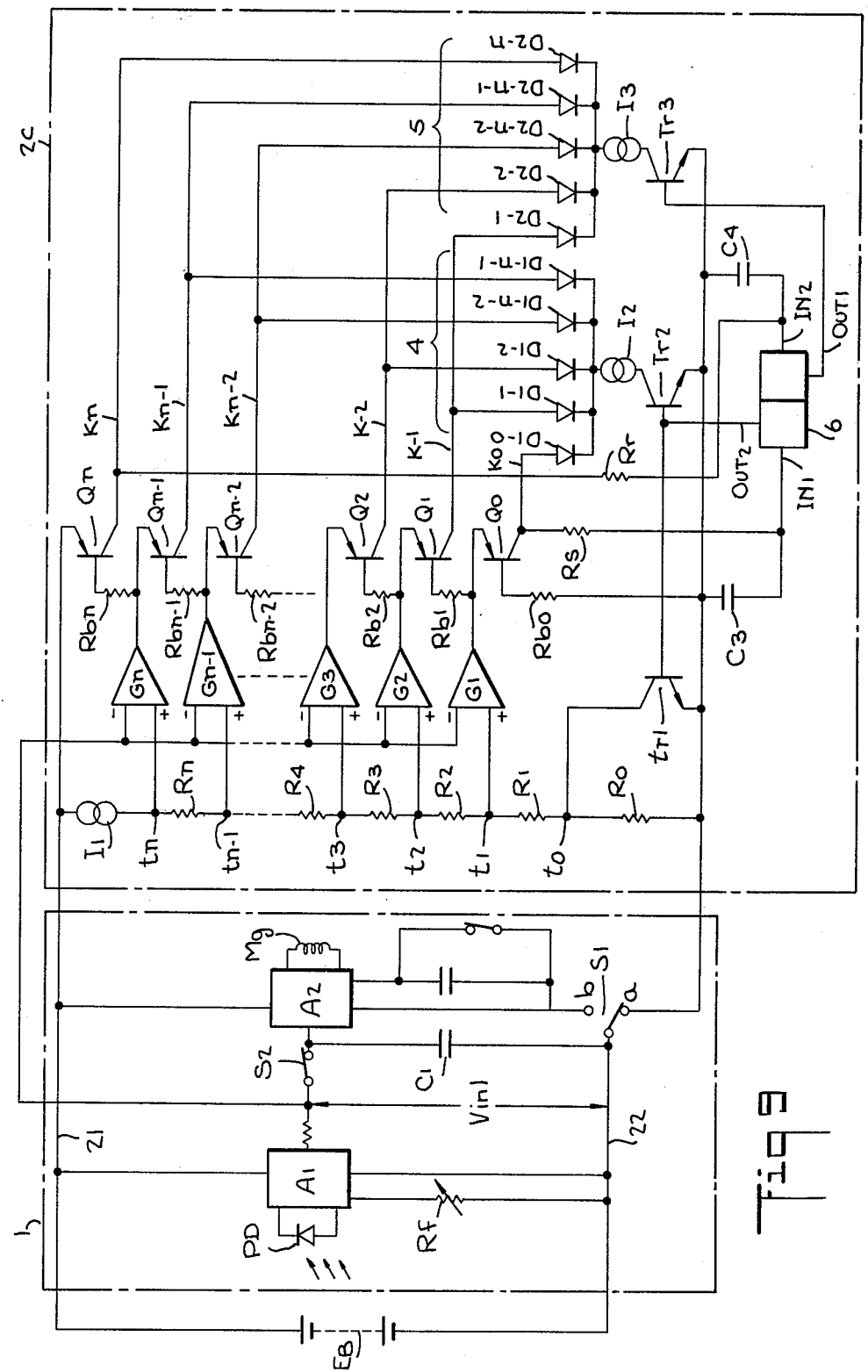
FIG. 9 is a schematic circuit diagram depicting a fourth embodiment of the indicator arrangement according to the present invention.

FIG. 9 shows a fourth embodiment of the indicator arrangement of the present invention wherein a known electric shutter circuit 1 serves as an analog signal source as in the first embodiment shown in FIG. 1 and wherein the same portions as in said first embodiment are indicated by the same symbols and are therefore not explained in detail.

The indicator arrangement 2C is provided with a flip-flop circuit 6 (hereinafter referred to as FF) functioning as a bistable circuit of which one input terminal IN1 is connected to the collector of the transistor Q0 through a resistor RS while the other input terminal IN2 is connected to the collector of transistor Qn through a resistor Rr. The FF6 changes the state thereof according to the change in the signals from transistors Q0, Qn and releases H or L signal indicating the state from two output terminals OUT1 and OUT2, namely L and H signals respectively at the terminals OUT1 and OUT2 when the transistor Q0 is turned ON to develop an H signal to the input terminal IN1 while H and L signals respectively at the terminals OUT1 and OUT2 when the transistor Qn is turned ON to release an H signal to the input terminal IN2. A transistor Tr1 of which the base is connected to the output terminal OUT2 of FF6 is further connected respectively through the collector and emitter electrodes thereof to the connecting point t0 and the line 22. Also a transistor Tr2 of which the base is connected to the output terminal OUT2 of FF6 is further connected, through the collector and emitter thereof respectively, to the constant-current source I2 and the line 22. Also a transistor Tr3 of which the base is connected to the output terminal OUT1 of FF6 is further connected, respectively through the collector and emitter thereof, to the constant-current source I3 and the line 22. Between the line 22 and two input terminals IN1, IN2 of FF6 there are respectively provided capacitors C3 and C4 as delay capacitors for preventing, as will be discussed later, the erroneous function of FF circuit 6 by the noise containing output of comparators generated at the switching of digitalizing voltages of the ladder resistors by the inversion of FF circuit 6, the capacitors providing delay periods of time for prolonging, within a practically allowable extent, the triggering period required for the inversion of the FF circuit 6.

Now there will be explained the function and operation of this embodiment. Prior to the shutter release the indicator arrangement 2C is ready to function since the shutter switch S1 selects the terminal a. Also the memory capacitor C1 is charged to a voltage corresponding to the shutter speed determined by the quantity of light coming into the photodiode PD from an object, a photosensitivity of photographic film and a diaphragm value, charged voltage $V_{in1}$ being selected lower or higher respectively for a faster or a slower shutter speed. In this state the FF circuit 6 is assumed to be in a state of producing L and H signals respectively at the output terminals OUT1 and OUT2, thus the transistors Tr1 and Tr2 being in ON state and transistor Tr3 being in OFF state.

When the voltage $V_{in1}$ is lower than the digitalizing voltage at the connecting point t1, all the comparators G1-Gn release H signals. The H and L signals from said comparators are discriminated hereafter by the corresponding suffixes, for example H1 or L1 from the comparator G1. The transistor Q0 receiving an L signal at the base thereof from the line 22, upon receipt of H1 signal at the emitter thereof from the comparator G1, is turned ON to transmit the H1 signal to the LED display element D1-0 and to the input terminal IN1 of the FF circuit 6 which however is not inverted because it is already in a state of L and H signals released respectively at the terminals OUT1 and OUT2, whereby maintaining the transistors Tr1, Tr2 in ON state and transistor Tr3 in OFF state. Thus the first LED display element group 4 is enabled while the second group 5 is disabled. The ON state of transistor Tr1 causes resistor R0 to be bridged which is so selected that the voltage V1' at the connecting point t1 in the OFF state of transistor Tr1 is equal to the voltage Vn at the point tn in the ON state of transistor Tr1 or slightly lower than said voltage Vn for realizing a hysteresis of an extent not affecting the measurement thereby achieving a stable function. Thus the digitalizing voltages generated at the connecting points t1-tn in the OFF state of the transistor Tr1 become higher than the digitalizing voltages in the ON state of transistor Tr1 by a voltage across the resistor R0, thereby lighting the LED element D1-0 to indicate an over exposure.

When the charged voltage $V_{in1}$ of memory capacitor C1 becomes higher than the digitalizing voltage at the point t1, the comparator G1 releases an L1 signal to turn OFF the transistor Q0 thereby extinguishing the LED element D1-0. On the other hand the comparator G2 releases or produces an H2 signal to turn ON the transistor Q1 to light the LED element D1-1 in the first LED element group 4. Along with the increase in the charged voltage $V_{in1}$ of memory capacitor C1 the inverted comparator is shifted from G2 to G3, then to G4 and so on, and the lighted LED element in first group 4 is correspondingly shifted. When the charged voltage $V_{in1}$ exceeds the digitalizing voltage at the connecting point tn-1, the comparator Gn-1 releases an Ln-1 signal to turn OFF the transistor Qn-2 and to turn ON the transistor Qn-1 thereby extinguishing the LED element D1-n-2 and lighting the element D1-n-1. Upon further increase of the charge voltage $V_{in1}$ beyond the digitalizing voltage of the connecting point tn, the comparator Gn releases an Ln signal to turn ON the transistor Qn which applies an H signal through the line 21 to the input terminal IN2 of FF circuit 6 which therefore is inverted and releases L and H signals from the output terminals OUT2 and OUT1, respectively. This state is retained until an H signal is applied to the terminal IN1. The transistor Tr2, receiving an L signal at the base electrode thereof, is shifted to its OFF state to disable the first LED group 4. Also the transistor Tr3, receiving an H signal at the base thereof, is turned ON to enable the second LED group 5. On the other hand the transistor Tr1, receiving an L signal at the base thereof, is turned OFF to elevate the digitalizing voltages at the connecting points t1-tn by a voltage across the resistor R0 in comparison with the case when the transistor Tr1 is ON. As mentioned above, the digitalizing voltage at the point t1 in the OFF state of transistor Tr1 is equal to or slightly lower than the digitalizing voltage at the point tn on the ON state of transistor Tr1. Consequently, upon turning OFF of transistor Tr1, the comparator G1 produces an L1 signal while the comparators G2-Gn release high-level signals H2-Hn, whereupon the transistor Q1, receiving L1 and H2 signals respectively at the base and emitter thereof, is turned ON to light the LED element D2-1 in the second LED group 5. On the other hand the transistors Q0, Q2-Qn are in OFF state. With the increase of the charged voltage $V_{in1}$, the comparator to be inverted is shifted from G2 to G3, then to G4 and so on, and the lighted LED element in the second LED group 5 is correspondingly shifted. When the charged voltage $V_{in1}$ exceeds the digitalizing voltage at the point tn, the comparator Gn releases an Ln signal to turn ON the transistor Qn, but the FF circuit 6 is not inverted as it is already inverted by the preceding ON state of the transistor Qn. Thus the ON state of transistor Qn causes the lighting of LED element D2-n, indicating an under exposure.

Now, when a slower shutter speed is selected for example by a change in the diaphragm or in the object during the above-mentioned state, the charged voltage $V_{in1}$ of the memory capacitor C1 is correspondingly lowered to shift the comparator to be inverted from Qn to Qn-1, then to Qn-2 and so on, with the corresponding shift in the lighted LED element from D2-n to D2-n-1, then to D2-n-2 and so on. When the charged voltage $V_{in1}$ becomes lower than the digitalizing voltage at the connecting point t1, the comparator G1 is inverted to turn OFF the transistor Q1 thereby extinguishing the LED element D2-1 and to simultaneously turn ON the transistor Q0 thereby inverting the state of FF circuit 6 which thereupon releases H and L signals at the output terminals thereof OUT2 and OUT1, respectively. The transistor Tr2 is therefore turned ON upon receipt of said H signal from the terminal OUT2 while the transistor Tr3 is turned OFF upon receipt of the L signal from the terminal OUT1 thereby enabling the function of the first LED element group 4. Simultaneously with the turning on of the transistor Tr2, the transistor Tr1 is also shifted to ON state to reduce the digitalizing voltages at the connecting points t1-tn by a voltage across the resistor R0 whereupon the comparator Gn releases an Hn signal while the other comparators release L signals. Transistor Qn-1, receiving the Ln-1 signal at the base thereof from the comparator Gn-1 and the Hn signal at the emitter thereof from the comparator Gn, is turned ON to light the LED element D1-n-1. Along with the descent of the charged voltage of memory capacitor C1, the comparator releasing an H signal is shifted from Gn to Gn-1, then to Gn-2 and so on, with the corresponding shift of the lighted LED element. Thus, when the charged voltage $V_{in1}$ becomes lower than the digitalizing voltage at the connecting point t1, the comparator G1 develops an H1 signal to turn ON the transistor Q0, but the FF circuit 6 is not longer inverted thus continuing to light the LED element D1-0 thereby indicating an over exposure.

FIG. 10 shows the relation between the function of comparators and two inputs thereto, i.e. the charged voltage of memory capacitor C1 and the digitalizing voltages, wherein the abscissa and ordinate respectively indicate the charged voltage $V_{in1}$ of memory capacitor C1 and the digitalizing voltages at various connecting points, in which the suffixes of the digitalizing voltages V1, V2, . . . , Vn correspond to those of connecting points shown in FIG. 9.

Figure 11:
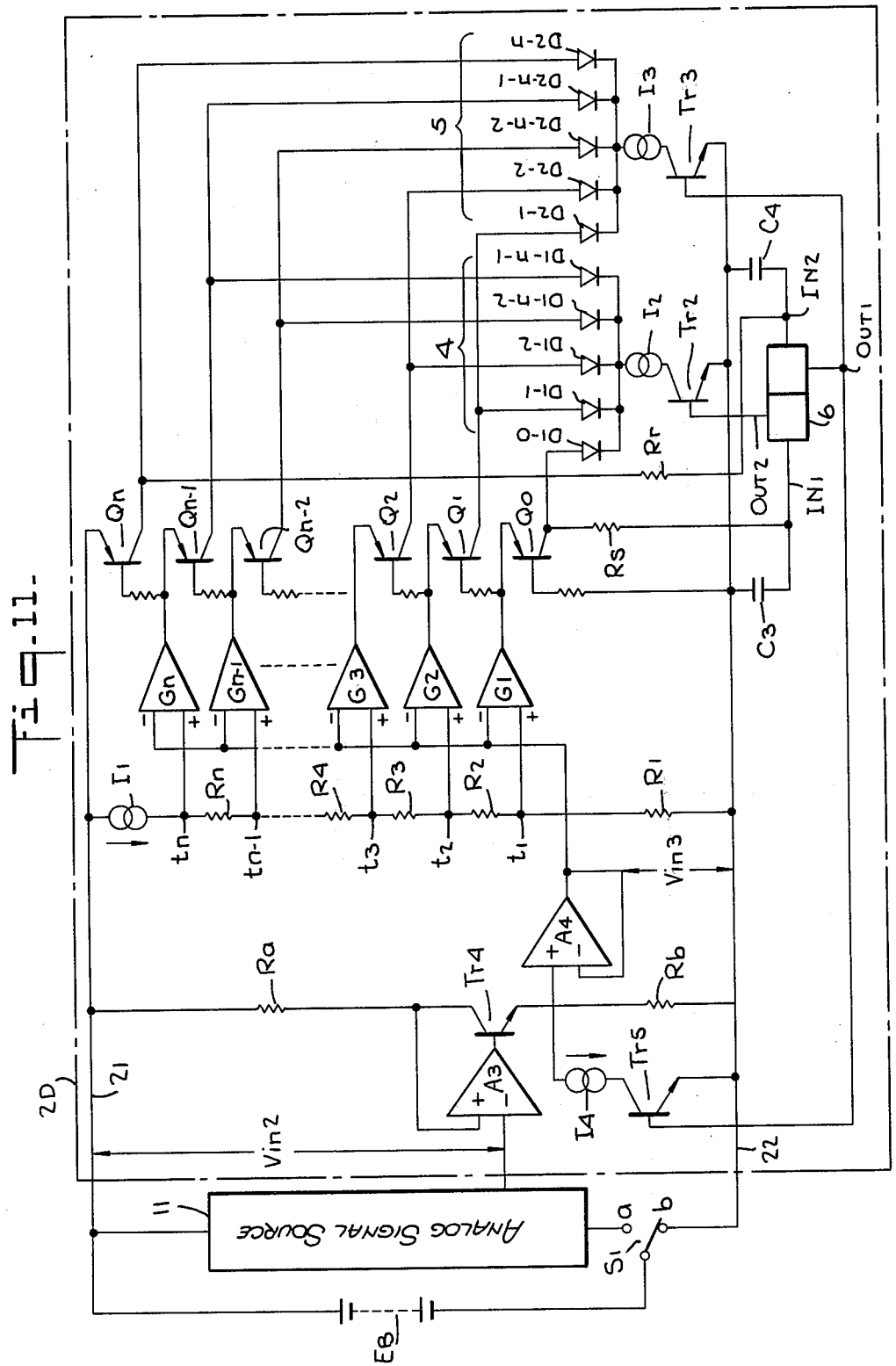
FIG. 11 is a schematic circuit diagram of a fifth embodiment of the indicator arrangement according to the present invention.

FIG. 11 shows a fifth embodiment of the indicator arrangement of the present invention wherein the portions of indicator arrangement 2D common with those in the fourth embodiment shown in FIG. 9 and in the second embodiment shown in FIG. 3 are represented by the same symbols and are therefore not explained in detail. In this fifth embodiment the digitalizing voltages applied to the non-inverted input terminals of comparators are fixed while the analog input signal voltage applied to the inverted input terminals thereof is made to oscillate.

In FIG. 11, an analog input voltage $V_{in2}$ from an analog signal source 11 is supplied between an inverted input terminal of an operational amplifier A3 and the power feed line 21. The non-inverted input terminal of amplifier A3 is connected to line 21 through a resistor Ra. There is provided a transistor Tr4 of which the collector is connected to the non-inverted input terminal of operational amplifier A3, the base to the output terminal of amplifier A3 and the emitter to the line 22 through a resistor Rb. The above-mentioned components constitute a voltage-current converting circuit wherein, assuming that $h_{fe}$ of transistor Tr4 being much larger than unit, the collector current is approximately equal to the emitter current thereof and is determined by the analog input voltage $V_{in2}$ and the resistor Ra. An operational amplifier A4 constituting a voltage follower circuit receives an input voltage across the resistor Rb receiving the emitter current of transistor Tr4 and releases a corresponding output voltage $V_{in3}$ to the inverted input terminals of comparators G1-Gn. The ladder resistor R0 in FIG. 9 is eliminated, and the digitalizing voltages of the non-inverted input terminals of comparators G1-Gn are selected as those obtained when the transistor Tr1 is in its ON state in FIG. 9. The resistor Rb is connected in parallel with a constant-current sink I4, and the emitter current of transistor Tr4 flowing thereinto is switched by the ON-OFF change of the transistor Tr5, of which base is connected to the other output terminal OUT1 of FF circuit 6 to allow the ON-OFF control by the state of FF circuit 6.

Now, with an increase of the analog input voltage $V_{in2}$, the output voltage $V_{in3}$ of the operational amplifier A4 is correspondingly increased to elevate the voltages to the inverted input terminals of comparators G1-Gn. When output voltage $V_{in3}$ is lower than the digitalizing voltage at the connecting point t1, all the comparators G1-Gn release H signals to turn ON the transistor Q0 and turn OFF the transistors Q1-Qn, whereupon the FF circuit 6 receives the H1 signal from the comparator G1 to an input terminal IN1 to release H and L signals respectively at the output terminals OUT2 and OUT1 until an H signal is applied to the input terminal IN2. Thus the transistor Tr2 is turned ON while the transistors Tr3 and Tr5 are turned OFF, and the LED element D1-0 is lighted by the conduction of transistor Q0. Thus, along with the increase of the output voltage $V_{in3}$ from the operational amplifier A4, the comparator to be inverted is shifted from Ga to G3, then to G4 and so on in the aforementioned manner, and the lighted LED element in the first LED element group 4 is correspondingly shifted. When the output voltage of amplifier A4 exceeds the digitalizing voltage at the point tn to invert the comparator Gn, there is released an Ln signal to turn OFF the transistor Qn-1 to extinguish the LED element D1-n-1 while the transistor Qn is turned ON to supply an H signal to the other input IN2 of the FF circuit 6 which thereupon is inverted and releases L and H signals to the output terminals OUT2 and OUT1, respectively. The transistor Tr2 is turned OFF in response to the L signal while the transistor Tr3 is turned ON in response to the H signal. Also the transistor Tr5, upon receipt of the H signal, connects the current source I4 in parallel with the resistor Rb, thus dividing the emitter current of transistor Tr4. In this case the current to source I4 is so determined as that the output voltage $V_{in3}$ of the operational amplifier A4 is equal to the digitalizing voltage at the point t1 or slightly higher than the voltage with a certain hysteresis as mentioned in the foregoing. Consequently when the comparator Gn turns ON the transistor Qn to invert the state of FF circuit 6, the output voltage $V_{in3}$ of amplifier A4 is lowered to a level allowing the the inversion of the comparator G1 alone. Thus the comparator G1 releases an L1 signal while the other comparators G2-Gn release signals H2-Hn to turn ON the transistor Q1 and turn off the transistors Q0, Q2-Qn thereby lighting the LED element D2-1 in succession to the element D1-n-1. A further increase of the output voltage $V_{in3}$ of the amplifier A4 causes the successive shifting of the comparator to be inverted in the aforementioned manner, with the corresponding shift of the LED element to be lighted in the second LED group 5. Upon inversion of the comparator Gn the transistor Qn is turned on to light the LED element Dn, which is maintained in a lighted state since the FF circuit 6 is no longer inverted upon turning ON of the transistor Qn which therefore maintains the ON state thereof.

Now in the case of a descent of the output voltage $V_{in3}$ of the operational amplifier A4 from the above-mentioned state, the comparators are inverted in succession from Gn to Gn-1, then to Gn-2 and so on with the successive release of H signals at the output terminals thereof. When the output voltage of amplifier A4 becomes lower than the digitalizing voltage at the point t1, the comparator G1 is inverted to turn ON the transistor Q0 thereby inverting the FF circuit 6 and turning OFF the transistor Tr5. In that manner the output voltage $V_{in3}$ of the amplifier A4 is maintained equal to or slightly lower than the digitalizing voltage at the point tn, and the comparator Gn continues to release an Hn signal. Then, along with the descent of the output voltage $V_{in3}$ of amplifier A4, the H signals are released in succession by the comparators Gn-1, then Gn-2 and so on. When the output voltage $V_{in3}$ becomes lower than the digitalizing or quantizing voltage at the connecting point t1, the comparator G1 releases an H1 signal to turn ON the transistor Q0, but the FF circuit 6 is no longer inverted to continue to light the LED element D1-0.

Figure 12:
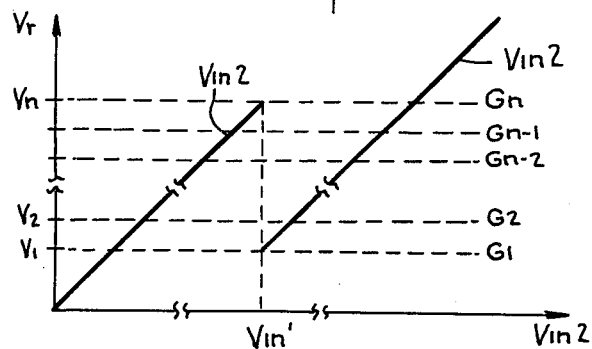
FIG. 12 is a time chart for use in understanding the function of the fifth embodiment.

FIG. 12 shows the relationship between the above-mentioned operations of the comparators and two inputs thereto, i.e. the output voltage $V_{in3}$ of operational amplifier A4 and the digitalizing voltage, and the relationship between the analog input voltage $V_{in2}$ and the output voltage $V_{in3}$. In the figure the abscissa and ordinate respectively indicate the analog input voltage $V_{in2}$ and the digitalizing voltages at the various connecting points of ladder resistors.

In the foregoing fourth and fifth embodiments, it is possible to reduce terminal pins of the intergrated circuit package if the first and second LED element groups 4 and 5 are accommodated in one package as each drive line is connected to two LED display elements other than the elements D1-0 and D2-n. Also it is conveniently possible to differentiate the displaying brightness between the first and second groups 4, 5 if the values of the constant-current sources I2 and I3 are selected different.

For a number N of required display modes, there will be required comparators in a factor of N/2.

Figure 13:
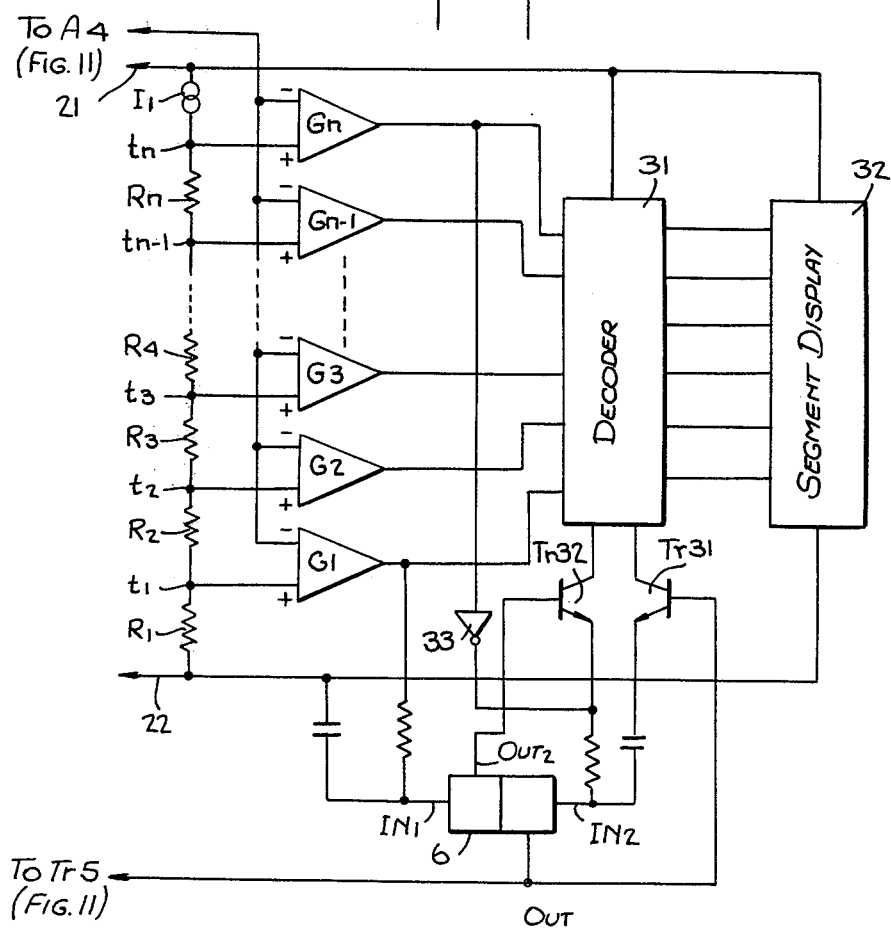
FIG. 13 is a schematic circuit diagram of a sixth embodiment of the indicator arrangement of the indicator arrangement according to the present invention, illustrating only a portion modified from fifth embodiment shown in FIG. 11.

FIG. 13 shows a sixth embodiment of the indicator arrangement in accordance with the present invention applied to segment displays, illustrating solely a portion different from that shown in FIG. 11. In this embodiment, the FF circuit 6 may be designed, as in the foregoing fourth or fifth embodiment, to switch whichever one input voltage among two inputs to the comparators. The output signal of the comparators is supplied to a decoder (segment driver) 31 for driving a segment display 32 composed for example of LEDs, incandescent lamps, liquid crystal devices, electrochromic elements etc., and the FF circuit 6 receives at one input terminal IN1 thereof the output signal of comparator G1 while at the other input terminal IN2 thereof it receives the output signal of comparator Gn after inversion through an inverter 33. Transistors Tr31 and Tr32 connected to the output terminals OUT1 and OUT2 of FF circuit 6 are turned ON or OFF according to the state thereof to switch the drive mode of decoder 31 thereby switching the display mode of the segment display 32. Although the details of operations are omitted, the comparators are made to perform multiple functions by the FF circuit 6 as in the foregoing fourth or fifth embodiment. In this manner the analog input voltage is numerically displayed on the segment display 32.

The trigger signal to FF circuit 6 which is generated by the transistors Q0 and Qn in the fifth embodiment or by the comparators G1 and Gn in the sixth embodiment, may also be obtained in the following manner, wherein there are provided a first detecting circuit provided with a standard voltage equal to the lowest digitalizing voltage applied to the comparator G1 and a second detecting circuit provided with a standard voltage equal to the highest digitalizing voltage applied to the comparator Gn, the output signals of the detecting circuits being utilized to trigger the FF circuit 6. Also in the foregoing fourth and fifth embodiments the description has been made in connection with LED display elements, but it is apparent that other electrooptical devices such as incandescent lamps, liquid crystal devices, electrochromic elements etc. may likewise be employable.

As discussed in the foregoing, the present invention enables each comparator to perform digitalizing on two analog input signal levels corresponding to the state change of a bistable circuit. Thus the number of digitalizable levels of analog input signal for a given number of comparators is doubled, without any change in power consumption of comparators. Also the number of ladder resistors remains same, thus allowing reduction of the chip area of integrated circuits when preparing the comparators and ladder resistors in an integrated circuit.

Although the present invention has been described in the foregoing with respect to the particular embodiments thereof, it will be apparent to those skilled in the art that various modifications are easily possible within the scope and spirit of the present invention.

What is claimed is:

1. An exposure indication device in a camera comprising:
    photometering means for generating an analog voltage corresponding to the brightness of a subject;
    a plurality of comparators (G1-Gn) for comparing said analog voltage which is received as a common input with respective different digitalized voltages, where the comparator (Gn) which compares said analog input voltage with the highest one of said digitalized voltages is referred to as a first comparator and the comparator (G1) which compares said analog input voltage with the lowest one of said digitalized voltage is referred to as a second comparator;
    control means having first and second control states occuring alternatively for permitting said plurality of comparators to perform a comparison of the analog input voltage in a first voltage range when said control means is in the first control state and for permitting said plurality of comparators to perform a comparison of the analog input voltage in a second voltage range when said control means is in the second control state, and the upper limit of the first voltage range is substantially equal to the lower limit of the second voltage range;
    display means for digitally indicating the analog input voltage in first and second display modes, the first display mode being performed with the comparator's outputs other than the first comparator's output which represents that the analog input voltage is above the highest digitalized voltage, and the second display mode being performed with the comparator's outputs other than the second comparator's output which represents that the analog input voltage is below the lowest digitalized voltage; and
    operation means for setting said control means and said display means into the second control state and the second display mode, respectively, in response to the first comparator's output which represents that the analog input voltage is above the highest digitalized voltage when said control means is in the first control state and setting said control means and said display means into the first control state and the first display mode, respectively, in response to the second comparator's output which represents that the analog input voltage is below the lowest digitalized voltage when said control means is in the second control state.

2. An exposure indication device in a camera according to claim 1, wherein said display means indicates an improper exposure in response to the second comparator's output which represents that the analog input voltage is below the lowest digitalized voltage when the display means is in the first display mode, and in response to the first comparator's output which represents that the analog input voltage is above the highest digitalized voltage when the display means is in the second dispay mode.

3. An exposure indication device in a camera according to claim 2, wherein said operation means comprising a hold circuit for maintaining a first state when the first comparator (Gn) receives the analog input voltage higher than the highest digitalized voltage and maintaining a second state when the second comparator (G1) receives the analog input voltage lower than the lowest digitalized voltage;
    the hold circuit in the second state operating to set said control means into the first control state and the hold circuit in the first state operating the set said control means into the second control state.

4. An exposure indication device in a camera according to claim 3, wherein the upper limit of the first voltage range is slightly higher than the lower limit of the second voltage range.

5. An exposure indication device in a camera according to claim 3 wherein said control means comprising a digitalized voltage switching means for switching the plurality of digitalized voltages to a first digitalized voltage range to permit said plurality of comparators to compare with the analog input voltage in the first voltage range at the time of the second state and for switching the plurality of digitalized voltages to a second digitalized voltage range to permit said plurality of comparators to compare with the analog input voltage in the second voltage range at the time of the first state.

6. An exposure indication device in a camera according to claim 3 wherein said control means comprises an analog voltage switching circuit for switching the value of the analog input voltage supplied to said plurality of comparators in such a manner as to enable comparison of the analog input voltage in said plurality of comparators in a first input voltage range when said hold circuit is in the second state and to enable comparison of the analog input voltage by said plurality of comparators in a second input voltage by said plurality of comparators in a second input voltage range when said hold circuit is in the first state.

7. An exposure indication device in a camera according to claim 3 wherein said hold circuit comprises:
    a first detecting circuit for developing a first output signal when the first comparator (Gn) receives the analog input voltage higher than the highest digitalized voltage;
    second detecting circuit for developing a second output signal when the second comparator (G1) receives the analog input voltage lower than the lowest digitalizing voltage; and
    a bistable circuit retained in a first state in response to the first output signal and in a second state in response to the second output signal.

* * * * *

UNITED STATES PATENT AND TRADEMARK OFFICE
CERTIFICATE OF CORRECTION

PATENT NO. : 4,334,745

DATED : June 15, 1982

INVENTOR(S) : OSAMU MAIDA

It is certified that error appears in the above—identified patent and that said Letters Patent is hereby corrected as shown below:

```
Column 1, line 21, between "as" and "other" delete --an--.
Column 2, line 29, between "as" and "other" delete --an--.
Column 4, line 39, change "reaches" to --reach--.
Column 6, line 11, change "release" to --releases--.
Column 7, line 34, change "through" to --though--.
Column 9, line 7, to be consistant change "operation" to
   --operational--.
Column 13, line 56, change "RS" to --R8--.
Column 14, line 5, change "OUT 2" to --OUT 1--.
Column 17, line 48, change "the the" to --the--.
```

Signed and Sealed this

Twenty-fourth Day of August 1982

[SEAL]

Attest:

GERALD J. MOSSINGHOFF

*Attesting Officer*  *Commissioner of Patents and Trademarks*